United States Patent [19]

Schrader et al.

[11] 4,189,737
[45] Feb. 19, 1980

[54] FIELD EFFECT TRANSISTOR HAVING AN EXTREMELY SHORT CHANNEL LENGTH

[75] Inventors: Lothar Schrader, Munich; Karlheinrich Horninger, Eglharting, both of Fed. Rep. of Germany

[73] Assignee: Siemens Aktiengesellschaft, Berlin & Munich, Fed. Rep. of Germany

[21] Appl. No.: 913,827

[22] Filed: Jun. 8, 1978

[30] Foreign Application Priority Data

Jun. 30, 1977 [DE] Fed. Rep. of Germany ....... 2729657

[51] Int. Cl.² ............................................. H01L 29/78
[52] U.S. Cl. ......................................... 357/23; 357/52; 357/54; 357/59; 357/91
[58] Field of Search ...................... 357/23, 24, 52, 59, 357/91, 54

[56] References Cited

U.S. PATENT DOCUMENTS

| | | | |
|---|---|---|---|
| 3,564,355 | 2/1971 | Lehovec | 357/23 |
| 3,657,614 | 4/1972 | Cricchi | 357/23 |
| 3,735,156 | 5/1973 | Krambeck et al. | 357/24 |
| 3,855,610 | 12/1974 | Masuda et al. | 357/23 |
| 4,087,795 | 5/1978 | Rossler | 357/23 |

OTHER PUBLICATIONS

T. Rodgers, et al., "An Experimental and Theoretical Analysis of Double-Diffused MOS Transistors," IEEE J. of S-S Ckts., vol. SC-10, No. 5, Oct. 1975, pp. 322-331.

*Primary Examiner*—Joseph E. Clawson, Jr.
*Attorney, Agent, or Firm*—Hill, Van Saten, Steadman, Chiara & Simpson

[57] ABSTRACT

A field effect transistor having an extremely short channel length in which a semiconductor substrate of one conductivity type has source and drain zones of the opposite conductivity type. A first gate electrode is separated from the substrate surface by a first insulating layer. The substrate has a surface side counter zone doping extending between the source and drain with the exception of a narrow strip-like zone which directly adjoins the source. The strip-like zone and at least an adjoining part of the surface side counter doped zone is covered by the first gate electrode. A second insulating layer is formed on the first gate electrode and on the drain side edge face of the first gate electrode. A coating on the second insulating layer covering that portion of the first insulating layer not covered by the first gate electrode is formed. The source side edge of the coating determines the drain side boundary of the strip-like zone. The source side edge of the first gate electrode determines the source side boundary of the strip-like semiconductor zone. The first gate electrode is connectable to a control voltage.

12 Claims, 1 Drawing Figure

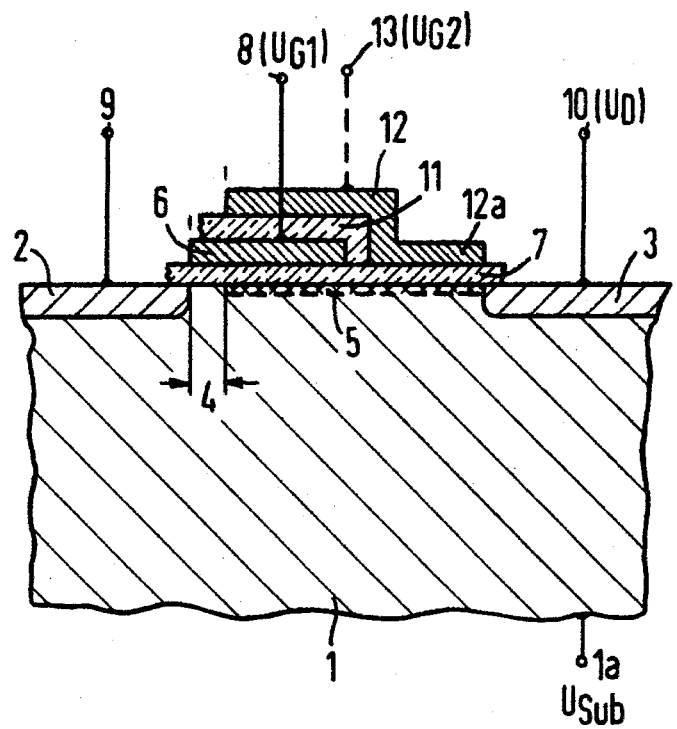

FIELD EFFECT TRANSISTOR HAVING AN EXTREMELY SHORT CHANNEL LENGTH

BACKGROUND OF THE INVENTION

The present invention relates to a field effect transistor having an extremely short channel length.

Transistors of this general kind are known, for example, from the technical publication, "IEEE Journal of Solid-State Circuits", Vol. SC-14 10, No. 5, Oct. 1975, pp. 322–331. In order to achieve a high "punch-through voltage" which is defined as that value of the drain voltage at which the drain-side depletion zones reaches the source zone, and in order to simultaneously avoid the drain voltage noticeably influencing the transistor internal resistance, the transistors described in this publication are designed as so-called DMOS field effect transistors which is to be understood as a MOS-transistor structure obtained by a double-diffusion technique. Here the source and drain zones are diffused into the surface of a doped semiconductor layer at a normal spacing, although this diffusion process is preceded by another in which, in the source zone, there is formed a diffusion trough which considerably reinforces the doping of the semiconductor layer and into which the source zone is then diffused.

In the DMOS-technique, a transistor channel is formed, the main part of which runs between the edge of the diffusion trough and the edge of the drain zone, whereas only a very small part thereof lies between the edge of the diffusion trough and the edge of the source zone embedded in the latter. This latter part determines the effective channel length of the transistor within which the charge carrier transportation is controlled by means of a gate electrode insulated from the semiconductor surface and a control voltage supplied to this gate electrode, whereas the punch-through voltage assumes values which also occur in MOS-transistors having a channel length which corresponds to the source-drain interval.

However, in field effect transistors produced in the DMOS-technique, the disadvantage occurs that the effective channel length is dependent upon the course of the double-diffusion process. As generally speaking, a plurality of similar transistors, which in particular are arranged on a common substrate, are simultaneously subjected to this process, the effective channel lengths and the saturation voltages of all these transistors—the latter assuming equal gate voltages—are identical to one another or at least have a process-dependent relationship to one another.

SUMMARY OF THE INVENTION

The aim of the invention is to provide a field effect transistor of the type described above having an extremely short channel length, wherein the above described disadvantages of known transistors do not occur. This is achieved in accordance with the invention by a design hereinafter to be described.

The field effect transistor in accordance with the present invention is characterized in particular by its effective channel length being determined by the mutual positioning of two layers which are arranged one above the other in different planes, where at least one of these layers consists of a gate electrode and where the boundaries of these layers can be individually defined in dependence upon the masks with which they are assigned. Therefore, in the case of a plurality of such transistors which are subjected to common diffusion processes, it is possible to achieve process-independent, differing dimensions of the effective channel lengths. Furthermore, it is easily possible to select and adjust the saturation voltage of the individual field effect transistors which occurs across the drain electrode when a bias voltage source is connected.

BRIEF DESCRIPTION OF THE DRAWING

A preferred exemplary embodiment of the invention will be described in detail in the following making reference to the drawing, where a field effect transistor has been illustrated in section.

DESCRIPTION OF A PREFERRED EMBODIMENT

A field effect transistor having a very short channel length includes a semiconductor layer 1, consisting for example of silicon, in which a channel zone runs along the surface thereof between n+doped source and drain zones 2 and 3. With the exception of a narrow, strip-like semiconductor zone 4 which directly adjoins the source zone 2, within the whole of the region between the source zone 2 and the drain zone 3 the semiconductor layer 1 is provided with a surface counter doping so that a zone 5 is formed which is only p⁻or even n-doped. The zone 4 and at least a part of the adjacent, counter-doped semiconductor zone 5 is covered by a first gate electrode 6 which is insulated from the surface of the semiconductor layer 1 by a first insulating layer 7 which consists, for example, of $SiO_2$. As schematically indicated in the drawing, the first gate electrode 6 is provided with a terminal 8 which is wired to a controlling gate voltage $U_{G1}$, whereas the source zone 2 is connected to a terminal 9 which is supplied with a reference potential, and the drain zone 3 is supplied with a drain voltage $U_D$ via a terminal 10. The semiconductor layer 1 is connected to a substrate potential $U_{Sub}$ via a terminal 1a.

A second gate electrode 12 which is connected via a terminal 13 to a bias voltage $U_{G2}$ is arranged above the gate electrode 6, separated from the latter by a further insulating layer 11 consisting, for example, of $SiO_2$. The outlines of the gate electrodes 6 and 12 are such that the source-side edge of the first gate electrode 6 runs somewhat above the source-side boundary of the strip-like semiconductor zone 4, whereas the source-side edge of the second gate electrode 12 runs somewhat above the drain-side boundary of the zone 4. The drain-side edge of the second gate electrode 12 runs somewhat above the boundary of the drain zone 3. Here the gate electrode 12 is designed in such a manner that a part 12a lies in the plane of the gate electrode 6.

When a positive bias voltage $U_{G2}$ is supplied to the second gate electrode 12 and when a positive drain voltage $U_D$ is connected to the terminal 10, the charge carrier transportation between the source zone 2 and the drain zone 3 is controlled in dependence upon a gate voltage $U_{G1}$ which is generally positive and which is fed to the first gate electrode 6. The control is carried out within an effective channel zone, the length of which conforms with the width of the strip-like semiconductor zone 4. The electrical mode of operation of the transistor corresponds to a field effect transistor of the enhancement type. The length of the effective channel zone is geometric, i.e., is determined by the mutual spacing between the source-side edges of the gate electrodes 6 and 12, and can be controlled by an adequately accurate adjustment of the masks employed in forming these electrodes, for example, photolithographically from the electrically conductive coatings applied in the relevant planes. When there are a plurality of such transistors produced in common operating processes, it is also possible for the effective channel lengths thereof to differ in that the mask components assigned to the individual transistors are designed to differ accordingly. The effective channel lengths of such transistors can amount, for example, to 1 μm or even less.

The saturation voltage $U_{DS}$ across the drain terminal 10 can be selected in a simple manner by virtue of the selection of the bias voltage $U_{G2}$, and in fact independently of the controlling gate voltage $U_{G1}$. Expediently, the bias voltage $U_{G2}$ is variable, and the saturation voltage of the transistor can also be individually adapted to the particular requirements during operation.

As a variation of the previously described embodiment, the gate electrode 12 can be replaced by a coating 12 which acts merely as implantation mask and which consists in particular of lacquer or another non-conductive material. In this case, the drain zone 3 must extend up to the drain-side edge of the gate electrode 6. Also, in this embodiment, the effective channel length of the field effect transistor controlled via the gate electrode 6 corresponds to the width of the zone 4. However, here the influences of the internal resistance by the drain voltage $U_D$ is more manifest whereas on the other hand, the punch-through voltage is reduced.

In accordance with a further development of the principle of the invention, the semiconductor layer 1 is not, as described above, p-doped but p$^-$-doped, in which case the counter-doped zone 5 is π- or n-doped. In this case, the doping of the strip-like semiconductor 4 is raised to a p-value, for example, by a local implantation of acceptor ions. The p$^-$-doping results in a reduction in the interference capacitances at the pn-junctions of the source- and drain-zones 2 and 3 without causing any change in the other electrical properties of the transistor.

The production precedure for the field effect transistor is accordance with the invention is expediently such that first the entire surface of the semiconductor layer 1 is provided with a counter-doping which is either sufficiently weak that the conductivity in the upper side of the layer is merely reduced or sufficiently strong that the conductivity type on the upper side of the surface reverses. The counter-doping is expediently carried out by a surface-side implantation of donor ions. There is subsequently applied a first insulating layer 7 which covers the semiconductor layer 1 and to which a first, electrically conductive coating is then applied. The outline of the gate electrode 6 is then defined from said coating, for example, photolithographically. Following the application of a second insulating layer 11 which covers the gate electrode 6, a second coating 12 is applied and defined in its outlines in accordance with the desired shape, for example, photolithographically. As a result of an implantation of acceptor ions in the approximate region of the source zone 2 which is carried out by ion acceleration which is such that although the gate electrode 6 is penetrated the overlapping coatings 6 and 12 are not, the strip-like zone 4 is then p-doped. Then, in the approximate region of the source zone 2 and the drain zone 3, an implantation of donor ions is carried out with an ion acceleration which is so low that only those parts of the semiconductor layer 1 which are covered neither by the gate electrode 6 nor by the coating 12 are affected. As a result, the n$^+$-doped source- and drain-zones 2 and 3 are formed, the channel-side boundaries of which are defined by the edge zones of the gate electrodes 6 and 12.

In accordance with a variant of the production process, prior to the second donor ion implantation the coating 12 is removed, at least where it projects beyond the gate electrode 6 on the drain side, so that in this case the drain-side edge of the gate electrode 6 defines the drain zone 3.

It is also possible to modify the aforementioned dopings of the field effect transistor in accordance with the invention so that the conductivity types of the individual semiconductor zones are reversed, in which case operating voltages of the opposite polarity must also be provided. The first gate electrode 6 and/or the second gate electrode 12 can consist of strongly doped semiconductor material, in particular polysilicon, or can take the form of a metallic coating consisting in particular of aluminum.

It will be apparent to those skilled in the art that many modifications and variations may be effected without departing from the spirit and scope of the novel concepts of the present invention.

We claim as our invention:

1. Field effect transistor having a short channel length, comprising a doped semiconductor layer of a first conductivity type provided with doped source and drain zones of the opposite conductivity type inserted on the surface side of said substrate, a first gate electrode separated from the semiconductor surface by a first insulating layer, said doped semiconductor layer having a surface-side counter zone doping extending over the entire semiconductor zone between said source and said drain zones with the exception of a narrow strip-like semiconductor zone which directly adjoins said source zone, said strip-like semiconductor zone and at least an adjoining part of the surface-side counter-doped semiconductor zone being covered by a first gate electrode, a second insulating layer on said first gate electrode and on the drain side edge face of said first gate electrode, a coating on said second insulating layer which also covers that portion of said first insulating layer not covered by said first gate electrode, the source-side edge of said coating determining the drain side boundary of said strip-like semiconductor zone, the source-side edge of said first gate electrode determining the source-side boundary of said strip-like semiconductor zone, and said first gate electrode being provided with a control voltage terminal.

2. Field effect transistor as claimed in claim 1, in which said coating is electrically conductive and in which a terminal thereto provided for connection to a bias voltage source.

3. Field effect transistor as claimed in claim 2, in which said first gate electrode and said electrically conductive coating consists of strongly doped polysilicon.

4. Field effect transistor as claimed in claim 2, in which said first gate electrode or said electrically conductive coating consists of strongly doped polysilicon.

5. Field effect transistor as claimed in claim 2, in which said first gate electrode and said electrically conductive coating consists of strongly doped semiconductor material.

6. Field effect transistor as claimed in claim 2, in which said first gate electrode or said electrically conductive coating consists of strongly doped semiconductor material.

7. Field effect transistor as claimed in claim 2, in which said first gate electrode and said electrically conductive coating consists of a metallic coating composed of aluminum.

8. Field effect transistor as claimed in claim 1, in which said coating serves merely as implantation mask and that said drain zone extends to beneath said drain-side edge of said first gate electrode.

9. Field effect transistor as claimed in claim 1, in which said counter doping is such that the conductivity type of said semiconductor layer reverses on the surface side.

10. Field effect transistor as claimed in claim 6, in which said narrow strip-like semiconductor zone has a higher surface-side doping than the remaining part of said semiconductor layer.

11. Process for the production of a field effect transistor as claimed in claim 1, in which said doped semiconductor layer is first provided with a surface-side counter doping, that following the application of said insulating layer which covers the semiconductor layer said first gate electrode is applied above said insulating layer and its outline is formed, that following the application of a second insulating layer which covers said gate electrode, an electrically conductive coating is applied above said second insulating layer and its outline is formed, that the drain-side outline of said coating is established to be such that it determines the boundary of said drain zone, that in the region of said narrow strip-like semiconductor zone and said source zone a first ion implantation is carried out as a result of which the surface-side counter doping is selectively cancelled, the ion acceleration being selected to be such that all those parts of said semiconductor layer which are not simultaneously covered by said first gate electrode and said electrically conductive coating are subjected on the surface side to implanted ions, and that a second ion implantation is carried out approximately in said source and drain region, as a result of which the oppositely doped source and drain zones are produced, ion acceleration being selected to be such that only those parts of said semiconductor layer being covered neither by said first gate electrode nor by said electrically conductive coating are subjected on the surface side to implanted ions.

12. Process for the production of a field effect transistor as claimed in claim 8, in which said doped semiconductor layer is first provided with a surface counter doping, that following the application of a first insulating layer which covers said semiconductor layer said first gate electrode being applied above said first insulating layer and its outline is formed, that following the application of a second insulating layer which covers said first gate electrode, a coating is applied above said second insulating layer and its outline is formed, that in the region of said narrow, said strip-like semiconductor zone and said source zone a first ion implantation is carried out as a result of which the surface-side counter doping is selectively cancelled, where the ion acceleration is selected to be such that all those parts of said semiconductor layer not covered simultaneously by said first gate electrode and said coating are subjected on the surface side to implanted ions, that at least those parts of said coating which project beyond said first gate electrode on the drain side are removed, and that a second ion implantation is carried out approximately in one region of said source and said drain, as a result of which said oppositely doped source and drain zones are produced, where the ion acceleration is selected to be such that those parts of said semiconductor layer not covered by said first gate electrode are subjected on the surface side to implanted ions.

* * * * *